(12) United States Patent  
Zipp

(10) Patent No.: US 12,340,301 B2
(45) Date of Patent: Jun. 24, 2025

(54) PHOTONIC NEURAL NETWORK

(71) Applicant: SRI International, Menlo Park, CA (US)

(72) Inventor: Lucas Zipp, Palo Alto, CA (US)

(73) Assignee: SRI International, Menlo Park, CA (US)

( * ) Notice: Subject to any disclaimer, the term of this patent is extended or adjusted under 35 U.S.C. 154(b) by 799 days.

(21) Appl. No.: 17/596,090

(22) PCT Filed: Jun. 2, 2020

(86) PCT No.: PCT/US2020/035750
§ 371 (c)(1),
(2) Date: Dec. 2, 2021

(87) PCT Pub. No.: WO2020/247391
PCT Pub. Date: Dec. 10, 2020

(65) Prior Publication Data
US 2022/0300796 A1    Sep. 22, 2022

Related U.S. Application Data

(60) Provisional application No. 62/856,603, filed on Jun. 3, 2019.

(51) Int. Cl.
*G06N 3/067* (2006.01)
*G06N 3/08* (2023.01)

(52) U.S. Cl.
CPC ............... *G06N 3/067* (2013.01); *G06N 3/08* (2013.01)

(58) Field of Classification Search
CPC .......... G06N 3/08; G06N 3/045; G06N 3/067; G06N 3/0675; G06N 3/02
See application file for complete search history.

(56) References Cited

U.S. PATENT DOCUMENTS 5,080,464 A   1/1992  Toyoda
5,150,242 A   9/1992  Fellows
(Continued)

FOREIGN PATENT DOCUMENTS

EP   3690804 A1   8/2020
JP   S6033531 A   2/1985
(Continued)

OTHER PUBLICATIONS

Response to Office Action, and translation thereof, dated Jan. 10, 2023, from counterpart Japanese Application No. 2021-571577 filed Apr. 21, 2023, 19 pp.

(Continued)

*Primary Examiner* — Tina Wong
*Assistant Examiner* — Mary A El-Shammaa
(74) *Attorney, Agent, or Firm* — Shumaker & Sieffert, P.A.

(57) ABSTRACT

A photonic neural network device may include a planar waveguide; a layer having a changeable refractive index adjacent to the planar waveguide; and a plurality of electrodes. Each electrode may be electrically coupled to the layer having the changeable refractive index at a corresponding location of the layer having the changeable refractive index. Each electrode may be configured to apply a corresponding, configurable voltage to the corresponding location to affect a refractive index of the corresponding location of the layer having the changeable refractive index to induce an amplitude modulation or a phase modulation of a light waveform propagating through the photonic neural network device to configure a corresponding neuron of the photonic neural network device in order to perform a computation.

20 Claims, 5 Drawing Sheets

(56) References Cited

U.S. PATENT DOCUMENTS

| | | | |
|---|---|---|---|
| 5,388,169 | A | 2/1995 | Kobayashi et al. |
| 6,819,469 | B1 | 11/2004 | Koba |
| 11,836,609 | B2* | 12/2023 | Lamb ............... G06N 3/067 |
| 12,222,680 | B1* | 2/2025 | Raikov ............ G06V 10/82 |
| 12,229,662 | B2* | 2/2025 | Du ................... G06N 3/04 |
| 2005/0111775 | A1 | 5/2005 | Fridman et al. |
| 2010/0176278 | A1 | 7/2010 | Yokoyama |
| 2017/0351293 | A1 | 12/2017 | Carolan et al. |
| 2018/0211158 | A1 | 7/2018 | Shainline et al. |
| 2018/0284834 | A1 | 10/2018 | Abel et al. |
| 2019/0319633 | A1* | 10/2019 | Zou ............... H03M 1/1033 |
| 2021/0133547 | A1* | 5/2021 | Lin ................. G06N 3/067 |
| 2021/0192342 | A1* | 6/2021 | Hughes ........... G06N 3/0675 |
| 2022/0300796 | A1* | 9/2022 | Zipp ............... G06N 3/08 |
| 2023/0169339 | A1* | 6/2023 | Ferreira de Lima ................ G06N 3/0675 706/20 |
| 2023/0306253 | A1* | 9/2023 | Dobos ............. G06N 3/049 |
| 2023/0409894 | A1* | 12/2023 | Song ............... G06N 3/067 |
| 2024/0086698 | A1* | 3/2024 | Guo ................ G06N 3/0464 |

FOREIGN PATENT DOCUMENTS

| | | |
|---|---|---|
| JP | H03198031 A | 8/1991 |
| JP | H03256032 A | 11/1991 |
| JP | H06308452 A | 11/1994 |
| JP | 2012519311 A | 8/2012 |
| JP | 2019061496 A | 4/2019 |
| WO | 2010141122 A1 | 12/2010 |

OTHER PUBLICATIONS

Office Action, and translation thereof, from counterpart Japanese Application No. 2021-571577 dated Aug. 1, 2023, 6 pp.
Belt et al. "Ultra-low-loss Ta2O5-core / SiO2-clad planar waveguides on Si substrates," Optica, vol. 4, No. 5, May 2017, pp. 532-536.
Cybenko "Approximation by Superpositions of a Sigmoidal Function," Math. Control Signals Syst., vol. 2, Dec. 1989, pp. 303-314.
Desmet et al., "Silicon-on-insulator optical waveguides with liquid crystal cladding for switching and tuning," Proc. Eur. Conf. Opt. Commun., vol. 3, No. 1, Sep. 2003, pp. 430-431.
Di Falco et al. "Luneburg lens in silicon photonics," Opt. Express, vol. 19, No. 6, Mar. 2011, p. 5156-5162.
Hermann, "Integrated Optics With Liquid Crystals," Technology, 2000, 34 pp. (Applicant points out, in accordance with MPEP 609.04(a), that the year of publication, 2000, is sufficiently earlier than the effective U.S. filing date, so that the particular month of publication is not in issue.).
International Preliminary Report on Patentability from International Application No. PCT/US2020/035750, dated Dec. 16, 2021, 9 pp.
International Search Report and Written Opinion of International Application No. PCT/US2020/035750, dated Aug. 27, 2020, 11 pp.
Kobayashi et al. "2×2 Optical Waveguide Matrix Switch Using Nematic Liquid Crystal," IEEE Trans. Microw. Theory Tech., vol. 30, No. 10, Oct. 1982, pp. 1591-1598.
Lin et al., "All-optical machine learning using diffractive deep neural networks," Science vol. 361, No. 6406, Sep. 2018, 20 pp.
Monkade et al., "SiO Evaporated films topography and nematic liquid crystal orientation," J. Phys. Ilde Phys. II, vol. 7, Nov. 1997, pp. 1577-1596.
Shen et al. "Deep learning with coherent nanophotonic circuits," Nature Photon 11, Jul. 2016, pp. 441-446.
Terui et al., "Refractive-index-adjustable SiO2—Ta2O5 films for integrated optical circuits," Appl. Phys. Lett., vol. 32, No. 10, May 1978, 3 pp.
Zernike, "Luneburg lens for optical waveguide use," Opt. Commun., vol. 12, No. 4, Dec. 1974, pp. 379-381.
Response to Extended Search Report dated Dec. 16, 2022, from counterpart European Application No. 20817696.6, filed Jul. 10, 2023, 16 pp.
Response to Office Action dated Aug. 1, 2023, from counterpart Japanese Application No. 2021-571577 filed Nov. 30, 2023, 8 pp.
Extended Search Report from counterpart European Application No. 20817696.6 dated Dec. 16, 2022, 13 pp.
Notification of Reason for Refusal, and translation thereof, from counterpart Japanese Application No. 2021-571577 dated Jan. 10, 2023, 8 pp.
Vlannes et al., "Hybrid optical/electronic nonlinear optical devices", Optical Engineering, vol. 31, No. 1, Jan. 1992, pp. 121-133.

\* cited by examiner

PHOTONIC NEURAL NETWORK

TECHNICAL FIELD

The disclosure relates to neural networks and photonic processors for executing neural networks.

BACKGROUND

Artificial Neural Networks (ANN) are used extensively in machine learning and artificial intelligence (AI)-based applications and have placed increasing demands on digital processor technology. In response, AI hardware accelerators in the form of application specific integrated circuits (ASICs) have been developed to meet this demand. ASICs are still fundamentally limited by the speed and energy efficiency of traditional digital electronics. Optical or photonic-based processors are a promising alternative approach due to their ability to efficiently carry and process wideband data streams with minimal losses. However, previous photonic implementations of neural networks have suffered from severe limitations, such as a small number of neurons, a lack of reconfigurability due to dedicated optical connections between nodes, or a reliance on free space optical elements unsuitable for chip-scale integration.

SUMMARY

In some examples, the disclosure describes a photonic neural network device that includes a planar waveguide; a layer having a changeable refractive index adjacent to the planar waveguide; and a plurality of electrodes. Each electrode may be electrically coupled to the layer having the changeable refractive index at a corresponding location of the layer having the changeable refractive index. Each electrode may be configured to apply a corresponding, configurable voltage to the corresponding location to affect a refractive index of the corresponding location of the layer having the changeable refractive index to induce an amplitude modulation or a phase modulation of a light waveform propagating through the photonic neural network device to configure a corresponding neuron of the photonic neural network device in order to perform a computation.

In some examples, the disclosure describes a method that includes modelling a photonic neural network device. The photonic neural network device may include a planar waveguide; a layer having a changeable refractive index adjacent to the planar waveguide; and a plurality of electrodes. Each electrode may be electrically coupled to the layer having the changeable refractive index at a corresponding location of the layer having the changeable refractive index. Each electrode also may be configured to apply a corresponding, configurable voltage to the corresponding location to affect a refractive index of the corresponding location of the layer having the changeable refractive index to configure a corresponding neuron of the photonic neural network device in order to perform a computation. The method also includes training the modelled photonic neural network. Training the modelled photonic neural network may include selecting the corresponding, configurable voltages at corresponding locations so that the corresponding neurons result in a desired output waveform in response to an input waveform. The method further includes physically implementing the trained photonic neural network in a device based on the training.

In some examples, the disclosure describes a photonic neural network device that includes a plurality of neural network layers for a neural network. Each neural network layer may include a column of neurons, each neuron including a corresponding electrode adjacent to a layer having a changeable refractive index. The layer having the changeable refractive index is adjacent to a planar optical waveguide. Each neural network layer also may include a column of refractive or diffractive elements adjacent to the planar optical waveguide, wherein the photonic neural network is configured to induce an amplitude or a phase modulation of a light waveform propagating through the photonic neural network device to configured a corresponding neuron of the photonic neural network device in order to perform a computation.

The details of one or more examples are set forth in the accompanying drawings and the description below. Other features, objects, and advantages of the disclosure will be apparent from the description and drawings, and from the claims.

DETAILED DESCRIPTION

Figure 1:
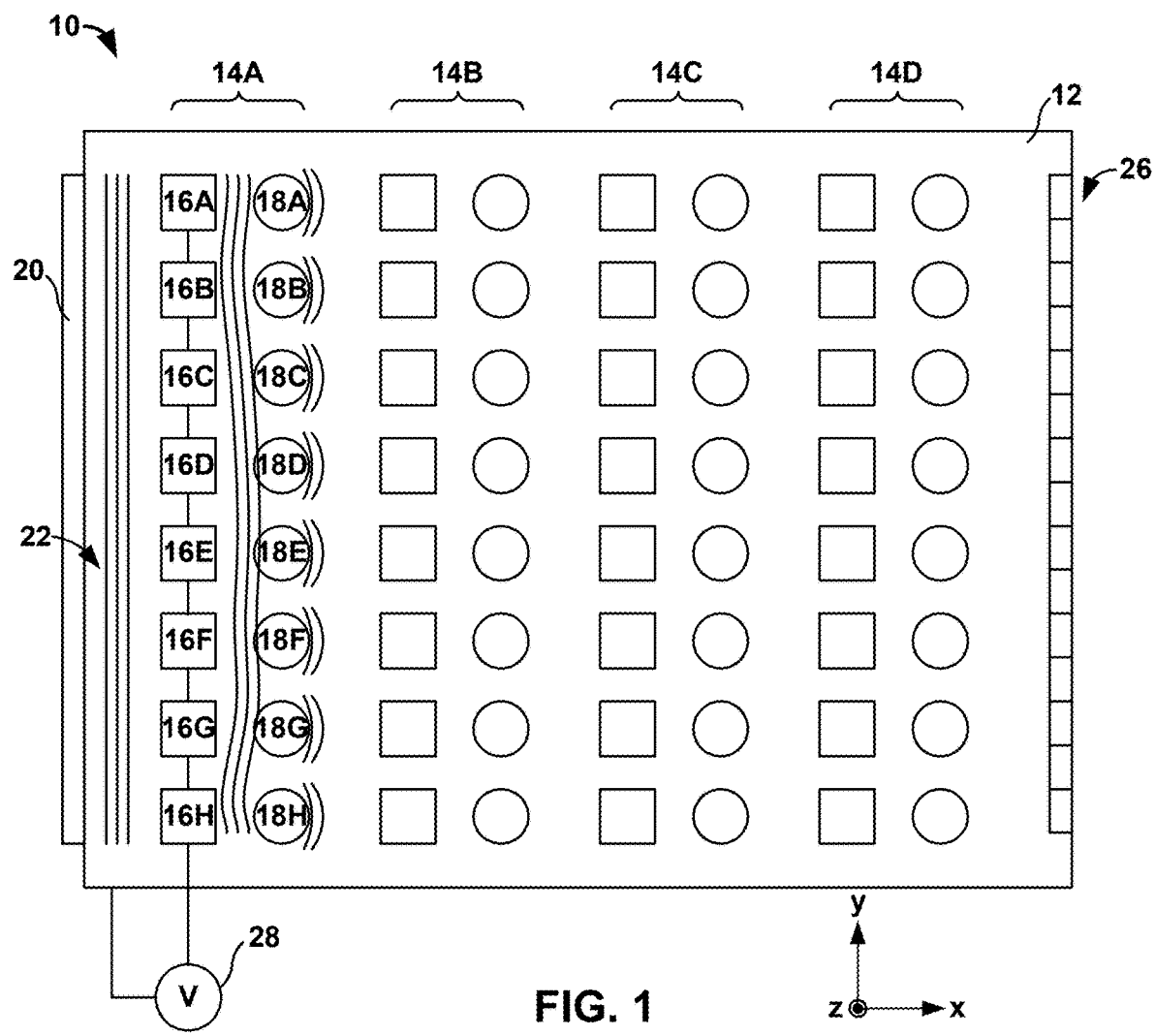
FIG. 1 is a conceptual diagram illustrating a plan view of an example photonic neural network device.

The disclosure describes photonic neural network devices and techniques for training and implementing a neural network in a photonic neural network device.

Despite the progress made in photonics over the past decades, in particular in photonic integrated circuit (PIC) technology, optical signal processing has been limited to performing single functions and algorithms. Developing a reconfigurable photonic processor has proven challenging, and designs have typically relied on optical or mechanical switching of the signal pathways between fixed photonic processing units. These solutions still suffer from limited reconfigurability and re-use of optical components, leading to increases in the overall photonic processor size as functions are added. More generic approaches of linked mesh networks of Mach-Zehnder modulator units provide a wider range of network flexibility, but are still limited to a few simple RF processing tasks like tunable bandpass filtering or channelization. This is in stark contrast to the range of reconfigurability afforded by digital electronics (e.g., field-programmable gate arrays, FPGAs), in which the processors are reconfigurable at the logic block level and allow for a wide range of functions or algorithms to be implemented.

A photonic processor with a high degree of reconfigurability can be achieved by implementing more generalizable computational architectures. Artificial neural networks and neuromorphic computing are well-suited for analog photonic implementations and can be trained and reprogrammed to compute a wide range of functions. In addition to image classification and artificial intelligence tasks, neural networks have been demonstrated to accurately perform RF signal classification and maximum likelihood estimation.

The powerful functionality of neural network architectures and their compatibility with analog photonic processing has led several research groups to develop various types of photonic neural networks. These architectures can be grouped into those based on free space optics, or those with a fixed waveguide architecture in a PIC. Free space optics implementations suffer from large system size, weight, and power (SWaP), and incompatibility with on-chip integration and control, while waveguide circuit-based approaches offer limited numbers of artificial neurons and substantial optical losses at waveguide couplings. Even complex multilayered neural network waveguide structures fabricated by researchers at National Institute of Standards and Technology (NIST) have been limited to 10 input neurons and 100 waveguide connections. This is orders of magnitude smaller than the 1,000+ neurons and connections needed to achieve the kind of powerful neural network required for image and signal processing tasks.

Even though the density and coupling efficiencies in PICs continue to increase, it is unlikely in the near future that purely waveguide-based architectures will achieve the density required for a large-scale neural network. New approaches are needed for implementing a programmable chip-based photonic neural network architecture scalable to thousands of neurons and connections.

Described herein are photonic neural network devices that include a planar waveguide, a layer having a changeable refractive index adjacent to the planar waveguide, and a plurality of programmable or configurable neurons. Each programmable or configurable neuron includes an electrode electrically coupled to the layer having the changeable refractive index at a corresponding location of the layer having the changeable refractive index. Each electrode is configured to receive a corresponding, configurable voltage from a voltage source and apply the corresponding, configurable voltage to the corresponding location to affect a refractive index of the corresponding location of the layer having the changeable refractive index. The voltage may be a DC voltage, an AC voltage, or combinations thereof, depending on the composition of the layer having the changeable refractive index. Controlling the refractive index of the corresponding location of the layer having the changeable refractive index configures the corresponding programmable or configurable neuron. In this way, the photonic neural network device uses voltage-controlled phase and amplitude wavefront engineering to implement a coherent photonic neural network.

By enabling a reprogrammable photonic neural network device with tens, hundreds, thousands, or more of neurons may outperform the speed and energy efficiency of state-of-the-art digital processors, while maintaining the flexibility to implement many different processing algorithms. In some examples, the photonic neural network device may be capable of processing speeds up to 10,000 TOPS (tera operations per second) while consuming less than 5 watts (leading to a performance per watt of greater than 2,000 TOPS/watt). By comparison, current state-of-the-art application specific integrated circuit (ASIC) artificial intelligence (AI) accelerators achieve about 90 TOPS with a power performance of about 2 TOPS/watt. This type of photonic neural network device may find application in high-performance real-time signal and sensor processing systems in which data throughput rates are currently constrained by digital processing power.

Figure 2:
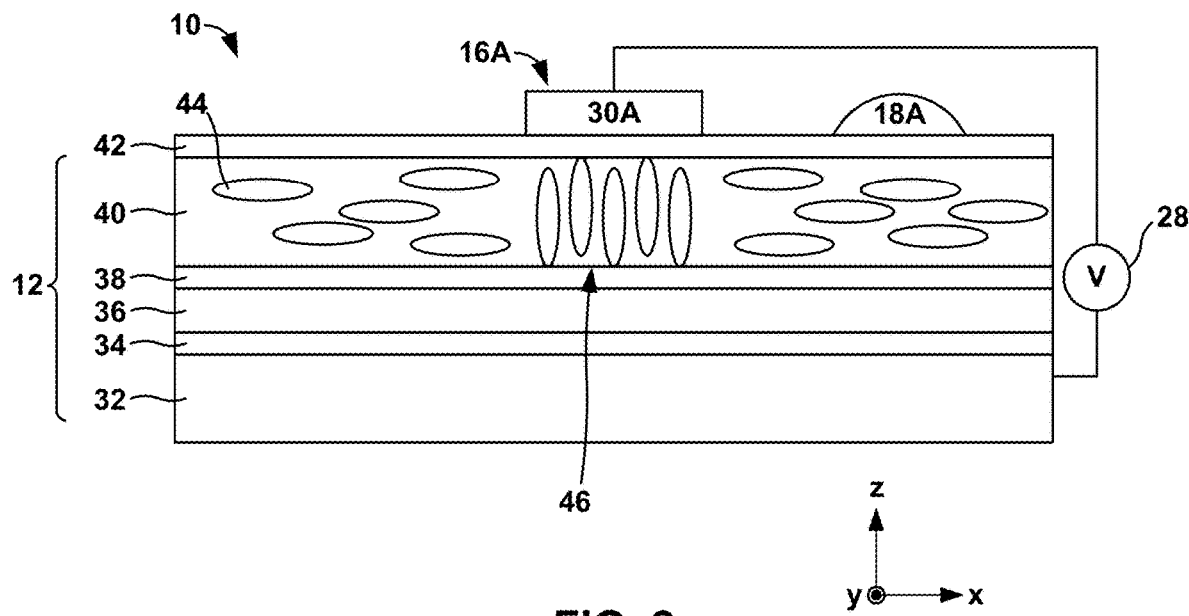
FIG. 2 is a conceptual diagram illustrating a side cross-sectional view of the example photonic neural network device of FIG. 1.

FIG. 1 is a conceptual diagram illustrating a plan view of an example photonic neural network device 10. FIG. 2 is a conceptual diagram illustrating a side cross-sectional view of the example photonic neural network device 10 of FIG. 1. Photonic neural network device 10 includes a body 12 that includes a plurality of layers, as shown in FIG. 2. Each layer contributes to the functionality of photonic neural network device 10.

Generally, photonic neural network device 10 includes a plurality of neural network layers 14A-14D (collectively, "neural network layers 14"). Each neural network layer includes a column of neurons 16A-16H (collectively, "neurons 16") and, optionally, a column of refractive or diffractive elements 18A-18H (collectively, "refractive or diffractive elements 18"). Although FIG. 1 illustrates four neural network layers 14, each neural network layer including eight neurons 16 and eight refractive or diffractive elements 18, photonic neural network device 10 may include any number of neural network layers 14, any number of neurons 16 in each neural network layer, and any number of refractive or diffractive elements 18 in each neural network layer. The number of neurons 16 and number of refractive or diffractive elements 18 in each layer may be the same or may be different. Additionally, within each layer, the number of refractive or diffractive elements 18 may be the same as the number of neurons 16 or may be different.

Photonic neural network device 10 also includes a light source 20 configured to input light 22 into photonic neural network device 10 and an array of photodetectors 26 configured to sense light output from the last neural network layer (e.g., neural network layer 14D). Light source 20 may include one or more optical modulators, such as high-speed modulators configured to modulate the light at radio frequency (RF) rates. The optical modulators may amplitude modulate light 22, phase modulate light 22, or the like to represent information in the input vector to the neural network. In some examples, light source 20 may be configured to output high peak power pulsed light, which may be used to induce nonlinearities within photonic neural network device 10. Light source 20 (including the high-speed modulators) and photodetectors 26 may be integrated into body 12 or separate from and coupled to body 12.

Photonic neural network device 10 further includes a voltage source 28 configured to output a voltage for application to neurons 16. Although FIG. 1 illustrates a single line connecting voltage source 28 to neurons 16, voltage source 28 may be connected to each neuron 16A-16H in parallel, such that voltage source 28 may address each neuron 16A-16H individually to apply a (unique) corresponding, configurable voltage to each respective neuron 16A-16H. The voltages applied to each of the neurons 16 may therefore be different. Voltage source 28 may be similarly connected to each neuron in neural network layers 14B-14D. Voltage source 28 may in some implementations include control circuitry for controlling the voltages output to the neurons 16. Voltage source 28 may be configured to output DC voltages, AC voltages, or both.

As shown in FIG. 2, body 12 includes a plurality of layers. For example, body 12 may include a substrate 32. Substrate 32 may provide mechanical support to body 12 and provides a layer on which subsequent layers may be grown, deposited, or otherwise formed. In some examples, substrate 32 includes silicon, a silicon alloy, or another material usable with integrated circuit fabrication processes.

A lower cladding layer 34 is on substrate 32. Lower cladding layer 34 functions as a cladding layer for waveguide layer 36, which is on lower cladding layer 34. As such, lower cladding layer 34 exhibits a refractive index that is relatively different from a refractive index of waveguide layer 36, e.g., that is relatively lower than a refractive index of waveguide layer 36. In some examples, lower cladding layer 34 includes silica ($SiO_2$) or another relatively low refractive index material.

Waveguide layer 36 is a planar optical waveguide on lower cladding layer 34. Waveguide layer 36 includes a material that is substantially transparent to the wavelengths of light 22. Additionally, waveguide layer 36 exhibits a refractive index that is relatively different from the refractive index of lower cladding layer 34, e.g., that is relatively higher than a refractive index of lower cladding layer 34. In some examples, waveguide layer 36 may include a mixture of materials, such as a mixture of silica and tantalum pentoxide ($SiO_2$—$Ta_2O_5$). Silica exhibits a refractive index of about 1.45 and tantalum pentoxide exhibits a refractive index of about 2.05. By varying the amounts of silica and tantalum pentoxide in waveguide layer 36, the refractive index of waveguide layer 36 may be between 1.45 and 2.05. Selecting the refractive index difference between lower cladding layer 34 and waveguide layer 36 affects the phase and amplitude modulation achievable at neurons 16. Additionally, selecting the refractive index difference between waveguide layer 36 and layer 40 controls an amount of light 22 that enters layer 40 and is subject to phase and/or amplitude modulation at neurons 16. The material of waveguide layer 36 also may be selected to reduce propagation losses within device 10.

Body 12 optionally includes a relatively thin surface treatment layer 38 on waveguide layer 36, between waveguide layer 36 and a layer 40 having a changeable refractive index. Surface treatment layer 38 is configured to control alignment of molecules 44 in layer 40 in the absence of an applied electric field. For example, surface treatment layer 38 may include silica with a thickness of less than about 50 nm, which may cause molecules 44 in layer 40 to be aligned substantially parallel to layer 40 in the absence of an applied electric field. In other examples, another material and/or another thickness may be used for surface treatment layer 38, which may result in a different molecular alignment in layer 40 in the absence of an applied electric field (e.g., alignment substantially perpendicular to layer 40).

Layer 40 is adjacent to waveguide layer 36. As used herein, the term "adjacent" is used to mean a layer that is next to another layer, and encompasses both a first layer immediately next to (e.g., contacting) a second layer and a first layer next to a second layer with one or more intermediate layer present between the first and second layers. In contrast, the term "directly adjacent" is used to mean a layer that directly is next to (e.g., contacting) another layer, with no intermediate layers between the layers stated to be directly adjacent to each other. Layer 40 includes a material having a changeable refractive index. For example, the material may have a changeable refractive index in response to an applied electric field (e.g., the voltage applied by voltage source 28 at neuron 16A). The material having the changeable refractive index may include, for instance, a liquid crystal, such as a liquid crystal polymer (LCP). The crystalline domains of the liquid crystal may rotate in response to an applied electric field, and the amount of rotation may correspond to a magnitude of the applied electric field, within an operating range. In some examples, the material having the changeable refractive index is selected to exhibit a large refractive index change between no applied electric field and a maximum applied electric field, which may increase the dynamic range (phase or amplitude modulation) achievable at a neuron (e.g., neuron 16A).

In some examples, layer 40 is a single mode waveguide. For example, a thickness of layer 40 may be selected so that layer 40 exhibits single mode behavior. In some implementations, layer 40 may define a thickness (measured in the z-axis direction of FIG. 2) of less than about the wavelength of light 22, such as less than about one micrometer.

Body 12 optionally includes a relatively thin surface treatment layer 42 on layer 40. Surface treatment layer 42 is configured to control alignment of molecules 44 in layer 40 in the absence of an applied electric field. For example, surface treatment layer 42 may include silica with a thickness of less than about 50 nm, which may cause molecules 44 in layer 40 to be aligned substantially parallel to layer 40 in the absence of an applied electric field. In other examples, another material and/or another thickness may be used for surface treatment layer 42, which may result in a different molecular alignment in layer 40 in the absence of an applied electric field (e.g., alignment substantially perpendicular to layer 40).

As shown in FIG. 2, a neuron 16A includes a corresponding electrode 30A and a corresponding portion 46 of layer 40 adjacent to electrode 30A. Electrode 30A includes any suitable electrically conductive material and is electrically connected to voltage source 28, enabling voltage source 28 to apply a configurable voltage to electrode 30A. The shape, size, and material of electrode 30A are selected to provide a desired electric field shape within corresponding portion 46 of layer 40 to enable a desired maximum amplitude and/or phase shift in light 22 at neuron 16A. For example, electrode 30A may define a width and length (in the y-axis and x-axis directions, respectively) on the order of micrometers or tens of micrometers. In some examples, electrode 30A defines a width and length (in the y-axis and x-axis directions, respectively) of about 10 µm×10 µm. The size of electrode 30A affects a maximum phase and/or amplitude shift neuron 16A may impose on light 22, as a longer (in the x-axis direction) electrode 30A results in a longer portion 46.

Electrode 30A defines a substantially square or rectangular shape in the x-y plane of FIG. 2. In other examples, electrode 30A may define a more complex shape in the x-y plane of FIG. 2. The more complex shape may be selected to control (e.g., increase or decrease) fringe field effects and non-linear optical effects at neuron 16A.

Figure 3:
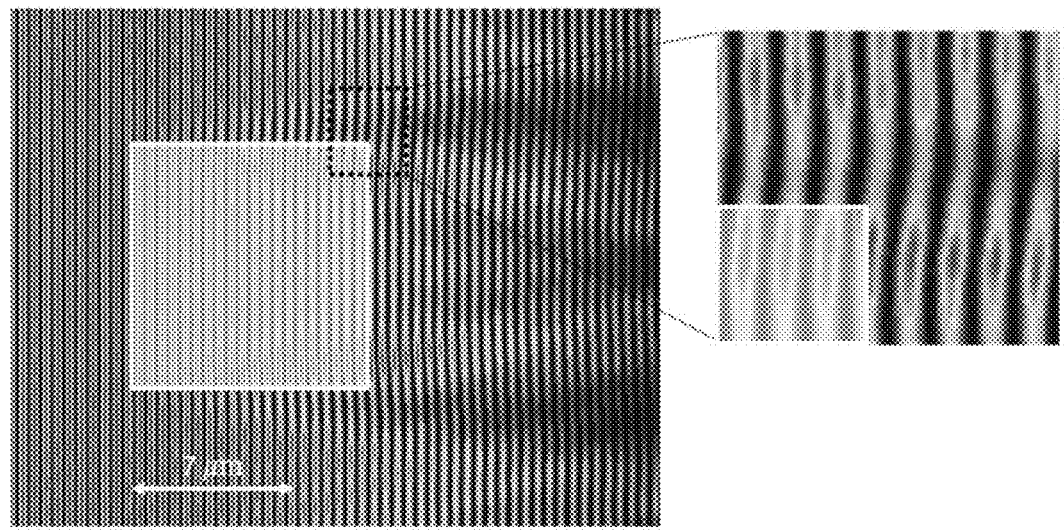
FIG. 3 is an image of simulated wave propagation and field intensity, in which an 10 $\mu m \times 10$ $\mu m$ electrode imposes a $\pi/4$ phase shift on light with a wavelength of 1.55 $\mu m$ in response to a layer having a changeable refractive index having its refractive index tuned from 1.5 to 1.6.

Phase and amplitude control at neuron 16A are provided by voltage control of a layer 40 (which may be a nematic liquid crystal cladding layer) on waveguide layer 36 (which may be a single-mode planar waveguide structure). Using a layer 40 that includes a liquid crystal may provide a large modulation in refractive index, while maintaining low optical absorption and scattering losses in waveguide layer 40. In examples in which layer 40 includes a liquid crystal, voltage source 28 may be configured to output a corresponding, configurable AC voltage to each electrode 30. The RMS value of each corresponding, configurable AC voltage may determine the degree of refractive index change of at each corresponding neuron. Changes in the alignment of the birefringent liquid crystal alters the refractive index of the layer 40, which in turn alters the field profile of the guided mode and modifies the effective mode index. Guided mode analysis shows a 2π phase shift is achievable over less than about 30 µm of propagation distance, which allows for a dense network of tunable phase shifters. In contrast, typical silicon modulators require greater than 1 mm of interaction length to achieve a 2π phase shift. Simulation of the voltage-controlled phase modulation of a single neuron in the proposed photonic network is shown in FIG. 3, in which an 10 µm×10 µm electrode imposes λ/4 phase shift on light with a wavelength of 1.55 µm in response to layer 40 having its refractive index tuned from 1.5 to 1.6.

Figure 4:
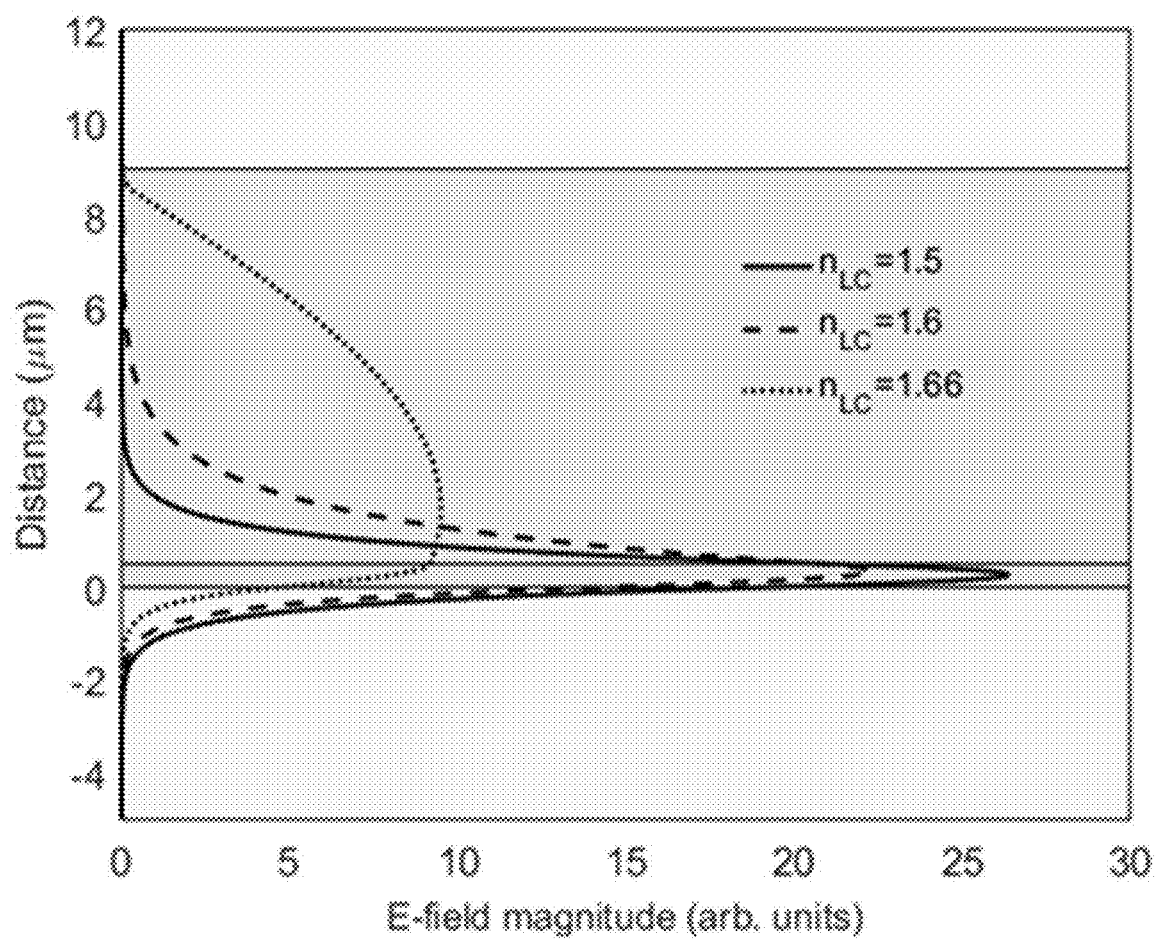
FIG. 4 is a plot of simulated field distribution of the $TE_0$ mode in an example photonic neural network device at different values of the TE-polarization refractive index of the voltage-controlled layer having a changeable refractive index.

Amplitude modulation can also be achieved by tuning the refractive index of layer 40 to near the refractive index of waveguide layer 36. There is a threshold at which no guided modes exist in waveguide layer 36, and the light radiates into layer 40, as shown in FIG. 4, which is a plot of simulated field distribution of the $TE_0$ mode in photonic neural network device 10 at different values of the TE-polarization refractive index of the voltage-controlled layer 40. Guided-mode analysis of photonic neural network device 10 at suggests a waveguide layer 36 having a refractive index of n=1.74 allows for a sufficient range of both phase and amplitude modulation. This allows for the same electrode 30A to perform either phase or amplitude modulation of light 22. The degree of amplitude modulation depends on the detailed properties of the liquid crystal alignment distribution in layer 40 and its optical scattering properties.

Inducement of nonlinear effects in layer 40 may be controlled (e.g., either intentionally induced or intentionally mitigated). Liquid crystals have large optical nonlinearities ($\chi^3 > 10^{-4}$ in esu units) related to thermal and laser-induced alignment of the liquid crystal molecules with greater than millisecond response times. These slow nonlinear effects may reduce the ultimate throughput rate of photonic neural network device 10. These effects may be mitigated by applying a low-amplitude AC voltage across the entire layer 40, which may greatly reduce the optical nonlinearity of nematic liquid crystals. On the other hand, to enable nonlinear calculations, nonlinearities may be intentionally induced using a light source 20 that is a high peak power pulsed light source, using electrodes with shapes that induce nonlinearities, or the like.

Figure 5:
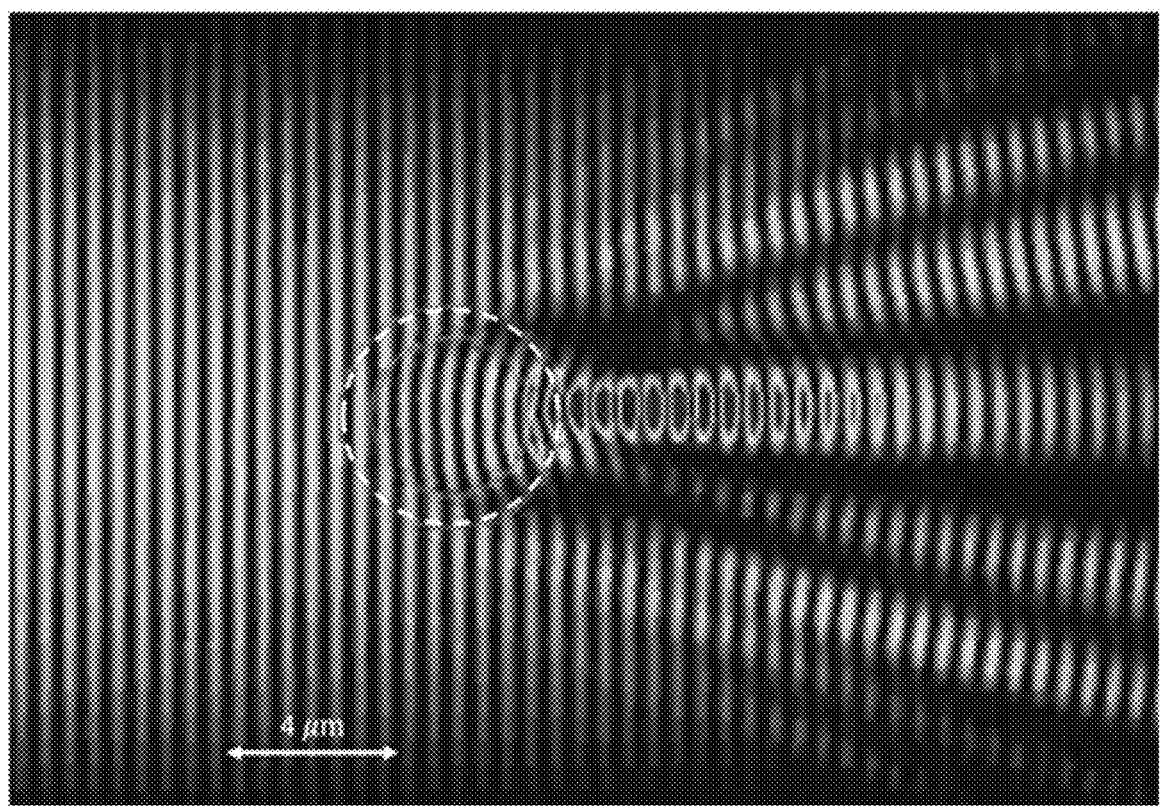
FIG. 5 is an image of a simulated wave propagation of 1.55 $\mu m$ light through a silicon Luneburg lens structure on top of a $SiO_2$—$Ta_2O_5$ waveguide layer.

Refractive or diffractive element 18A is also on surface treatment layer 42, like electrode 30A. Refractive or diffractive element 18A may be any suitable refractive or diffractive structure that causes controlled focusing or defocusing of light 22 at refractive or diffractive element 18A. For example, refractive or diffractive element 18A may include a planar waveguide lens, such as a Luneburg lens. A Luneburg lens includes a thin deposition of a high-index material on waveguide layer 40 (or surface treatment layer 42, if present) with a gradually varying depth profile. This in turn creates an effective graded-index profile for the guided light 22 in waveguide layer 40, which can be tailored to achieve differing lensing capabilities. The graded-index profile allows for high numerical aperture lensing, with negligible reflection and backscatter. FIG. 5 is an image of a simulated wave propagation of 1.55 µm light through a silicon Luneburg lens structure on top of a $SiO_2$—$Ta_2O_5$ waveguide layer. The $SiO_2$—$Ta_2O_5$ waveguide layer has a refractive index of about 1.74. The silicon Luneburg lens has a diameter of about 5 microns and a height of about 50 nm. FIG. 5 shows that such a lens allows for minimal backscatter and the high peak effective index generates a large scattering angle.

The configuration of refractive or diffractive element 18A may be selected to cause a selected spread of light 22 at refractive or diffractive element 18A. The spread of light 22, the spacing between refractive or diffractive element 18A and the previous column of neuron 16 in the x-axis of FIGS. 1 and 2, the spacing between refractive or diffractive element 18A and the next column of neurons 16 in the x-axis of FIGS. 1 and 2, and the spacing between neurons 16 within a column of neurons 16 in the y-axis of FIGS. 1 and 2 affect the number of effective connections between a neuron in one layer 14 and neurons in the next, downstream layer. For example, a larger spread of light 22, a larger spacing between refractive or diffractive element 18A and the next column of neurons 16 in the x-axis of FIGS. 1 and 2, and a smaller spacing between neurons 16 within a column of neurons 16 in the y-axis of FIGS. 1 and 2 may generally increase a number of effective connections, while a smaller spread of light 22, a smaller spacing between refractive or diffractive element 18A and the next column of neurons 16 in the x-axis of FIGS. 1 and 2, and a larger spacing between neurons 16 within a column of neurons 16 in the y-axis of FIGS. 1 and 2 may generally decrease a number of effective connections.

In some examples, refractive or diffractive element 18A may be a static structure, having a defined structure and resulting affect on the spread of light 22. In other examples, refractive or diffractive element 18A may be tunable or configurable, e.g., similar to neuron 16A. For example, refractive or diffractive element 18A may include a liquid crystal structure that changes refractive properties based on a voltage applied via an electrode. Forming refractive or diffractive element 18A as a tunable or configurable structure may enable greater configurability and programmability of photonic neural network device 10 by enabling the connections between layers 14 of photonic neural network device 10 to be reconfigured by controlling the spread of light at the refractive or diffractive element 18A.

In operation, light source 20 outputs light 22, which constitutes an input vector to the first neural network layer 14A. Light source 20 may include, for example, a linear array spatial light modulator that modulates light 22 to represent information in the input vector. Spatial light modulators are liquid crystal-based phase and amplitude modulators with relatively slow modulation rates on the order of kilohertz. As another example, light source 20 may include an array of high-speed modulators that modulate light at rates greater than 10 gigahertz (e.g., Si- or InP-based modulators). Light 22 may be edge-coupled into waveguide layer 36. Light 22 may be coherent.

Light 22 propagates to the first neural network layer 14A, and, more particularly, neurons 16. Voltage source 28 applies a corresponding, configurable voltage (AC or DC voltage) to a corresponding electrode at each neuron of neurons 16. The corresponding, configurable voltage causes each neuron 16 to apply a selected phase and/or amplitude shift to light 22 at that neuron 16. Phase control is enabled by the interaction of the evanescent field of the guided light 22 with layer 40, which alters the effective refractive index of the guided modes of light 22.

The light propagation through photonic neural network device 10 can be described as a series of weighted connections between each layer of neurons 16 (electrodes). The electric field at a neuron in the $l^{th}$ layer can be approximately modeled as the coherent sum of the contributions from all the neurons in the previous layer:

$$E_j^{(l)} = \sum_i w_i E_i^{(l-1)} f(\theta_{ij}) \frac{e^{ikr}}{\sqrt{r}},$$

where $w_i$ is the complex-valued voltage-controlled amplitude and phase bias of the $i^{th}$ neuron, $f(\theta_{ij})$ is the complex-valued scattering-phase function of the refractive or diffractive element, and $e^{ikr}/\sqrt{r}$, is the propagation factor set by the distance r between neurons. By programming the weights $w_i$ of the photonic neural network by controlling the corresponding, configurable voltages applied to the electrodes, photonic neural network device 10 may implement a broad class of functions. The output of the neural network is light sensed by array of photodetectors 26.

In other implementations, photonic neural network device 10 may include a waveform generator to generate a reference waveform and introduce the reference waveform into waveguide layer 36 after the final neural network layer (e.g., layer 14D) to interfere with the light 22 output by the final neural network layer. The photonic neural network device 10 may include multiple photodetector arrays to detect the resulting waveform. Such a configuration may enable phase and intensity information of the light 22 output by the neural network to be detected.

This hybrid design of photonic neural network device 10 enables a user to reconfigure and control the structure and parameters of a coherent photonic analog neural network, with connection weights between neurons 16 controlled through applied voltages on electrodes (e.g., electrode 30A). The dense geometry enables thousands of neurons and connections in a small 1 cm² region, which is an orders of magnitude improvement over previous photonic integrated circuit (PIC) neural network designs for RF signal processing that use fixed waveguide connections (less than 30 neurons in a 1 cm² region).

The describes photonic neural network device is energy efficient, since the feedforward processing is computed entirely through light propagation through passive optical elements. Power consumption is limited to the input electro-optic conversion, the laser source power (about 50 mW for shot-noise limited detection (depending on the specific implementation)), and the low-power (less than about 1 mW) AC electrode voltage for static control of the electrodes (e.g., electrode 30A). For high-speed (GHz) signal inputs to photonic neural network device 10, the power consumption is dominated by the electro-optic modulators of light source 20 (assumed to be about 5 pJ/bit for silicon modulators) and gives system processing efficiency of greater than 5000 TOPS/watt. In contrast, electronic FPGAs are currently limited to about 80 GFLOP/watt, while highly optimized ASICs for deep learning have achieved 2 TOPS/watt performance. The energy efficiency of the photonic processor is achieved due to the high-speed, near-lossless feedforward computation performed by the light propagation through the static photonic network.

Figure 6:
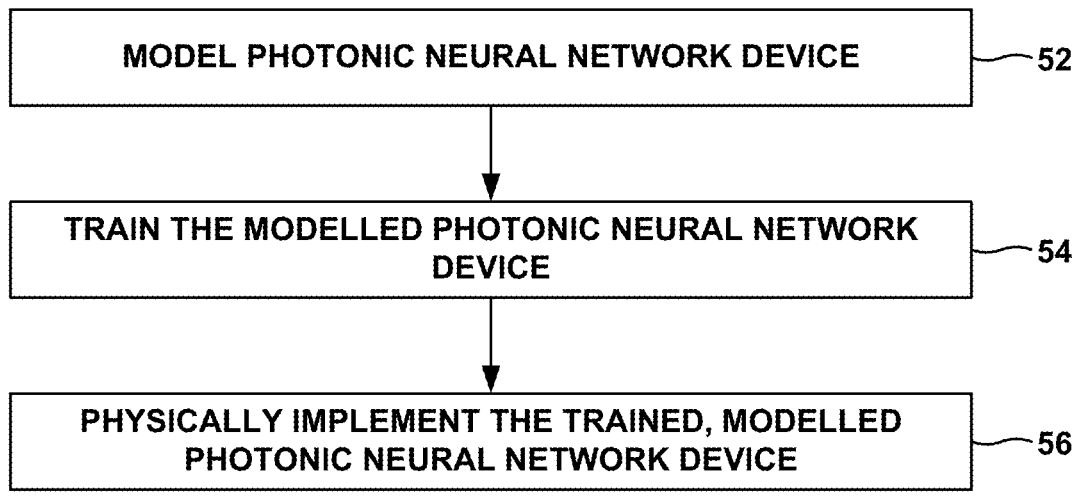
FIG. 6 is a flow diagram illustrating an example technique for training a photonic neural network device and implementing the trained photonic neural network device in hardware.

FIG. 6 is a flow diagram illustrating an example technique for training a photonic neural network device and implementing the trained photonic neural network device in hardware. The technique of FIG. 6 will be described with concurrent reference to photonic neural network device 10 of FIGS. 1 and 2. However, it will be understood that the technique of FIG. 6 may be used to manufacture a different device than photonic neural network device 10, and that photonic neural network device 10 may be manufactured using a different technique.

The technique of FIG. 6 includes modelling a photonic neural network device 10 (52). Modelling photonic neural network device 10 include generating equations or other numerical models that represent relevant properties and behavior of components of photonic neural network device 10, including, for example, at least waveguide layer 36, layer 40, neurons 16 (including electrode 30A of each one of neurons 16), refractive or diffractive elements 18 (if present), and the like. The relevant properties include the optical and electrical properties of waveguide layer 36 (alone or in combination with layers 34, 38, 40, and/or 42), the optical and electrical properties of layer 40 (alone or in combination with layers 34, 38, 40, and/or 42), and the like. The relevant properties may be incorporated in numerical model of device 10, e.g., as implemented in a computer aided modelling (CAM) and/or computer aided design (CAD) representation of device 10. For example, the CAD/CAM model may include a plurality of nodes, each node having associated therewith a representation of the properties of device 10 at that node. The nodes may extend at least through at least waveguide layer 36, layer 40, electrode 30A, and, if present refractive or diffractive elements 18. In some examples, the model may extend to light source 20, array of photodetectors 26, or both.

In some examples, rather than modelling a physical implementation of a particular device (including set spacing and sizes for particular components of the device), the model may represent relevant properties and behavior of individual components of a photonic neural network device 10, e.g., a neuron 16, a refractive or diffractive element 18, a waveguide layer 36, a layer 40 having a changeable refractive index, and the like. In some such examples, the spacing (e.g., in the x-axis and/or y-axis of FIGS. 1 and 2) may be configurable within the model to enable more degrees of freedom in training the model.

The technique of FIG. 6 also includes training the modelled photonic neural network device (54). Training the modelled photonic neural network device (54) includes selecting at least one of the corresponding locations of neurons 16 or refractive or diffractive elements 18 (if present), or the corresponding, configurable voltages (AC or DC) applied to the corresponding electrode 30A of each neuron of neurons 16 so that the corresponding neurons 16 produce a desired output waveform in response to an input waveform. As described above, in some examples, the locations of neurons 16 (and refractive or diffractive elements 18, if present) are fixed, e.g., to correspond to a pre-manufactured device, and the training includes only selecting corresponding, configurable voltages applied to the corresponding electrode 30A of each neuron of neurons 16. In other examples, the locations of neurons 16 (and refractive or diffractive elements 18, if present) are not fixed, e.g., the model does not correspond to a device that has been physically manufactured or the device includes an array of selectable electrodes that may be individually selected to define the locations of neurons 16.

Training the modelled photonic neural network device (54) may proceed similar to training of a digital neural network. Neural networks may generally enable a computing device to analyze input data and identify an action to be performed responsive to the input data. A neural network may be trained using training data that reflects likely input data. The training data may be labeled or unlabeled (meaning that the correct action to be taken based on a sample of training data is explicitly stated or not explicitly stated, respectively). The training of the neural network may be guided (in that a designer, such as a computer programmer may direct the training to guide the machine learning model to identify the correct action in view of the input data) or unguided (in that the machine learning model is not guided by a designer to identify the correct action in view of the input data). In some instances, the neural network is trained through a combination of labeled and unlabeled training data, a combination of guided and unguided training, or possibly combinations thereof.

The training of the modelled photonic neural network device results in determination of at least corresponding, configurable voltages (AC or DC) applied to the corresponding electrode 30A of each neuron of neurons 16 so that the corresponding neurons 16 result in a desired output waveform in response to an input waveform. The corresponding, configurable voltages correspond to weights applied to the light 22 at each respective neuron of neurons 16. In examples in which the corresponding locations of neurons 16 and/or refractive or diffractive elements 18 are also configurable or selectable during the training, the output of the training also may include a corresponding location for each neuron, each refractive or diffractive element, or both.

Once the modelled photonic neural network device has been trained, the trained photonic neural network may be physically implemented in a device based on the training (56). In some examples, physically implementing the modelled photonic neural network device includes manufacturing a photonic neural network device 10 that includes physical characteristics (e.g., locations of neurons 16, refractive or diffractive elements 18, shapes of electrode 30A, or the like) that correspond to those in the trained, modelled photonic neural network device. As such, the photonic neural network device 10 may be a fully custom device that uniquely corresponds to the trained, modelled photonic neural network device Physically implementing the modelled photonic neural network device additionally or alternatively may include generating firmware, software, or the like that controls operation of a pre-manufactured photonic neural network device 10 based on the training. For example, the firmware, software, or the like may include respective voltage values for each corresponding neuron of neurons 16 (e.g., the voltage to be applied to the corresponding electrode 30A of each neuron).

In other examples, physically implementing the modelled photonic neural network device includes selecting electrodes from among an array of electrodes of a pre-manufactured photonic neural network device 10 to which to apply a voltage so that the electrode functions as part of a neuron. For example, a pre-manufactured photonic neural network device 10 may include an array of electrodes on a surface of the pre-manufactured photonic neural network device 10. Electrodes from the array of electrodes may be individually addressed by voltage source 28 so that voltage source 28 may apply a corresponding, configurable voltage to each respective electrode. Electrodes to which voltage source 28 does not apply a voltage may not influence behavior of light 22. However, electrodes to which voltage source 28 does apply a voltage may act as a neuron, a refractive or diffractive element, or the like, depending the voltage applied to the electrode. Therefore, by including an array of electrodes from which particular electrodes may be selected may allow selection of locations of neurons 16, refractive or diffractive elements 18, or both, after manufacture of the photonic neural network device 10.

The techniques described in this disclosure may be implemented, at least in part, in hardware, software, firmware or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components.

The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

What is claimed is:

1. A photonic neural network device comprising:
a planar waveguide;
a layer having a changeable refractive index adjacent to the planar waveguide; and
a plurality of electrodes, wherein each electrode is electrically coupled to the layer having the changeable refractive index at a corresponding location of the layer having the changeable refractive index, wherein each electrode is configured to apply a corresponding, configurable voltage to the corresponding location to affect a refractive index of the corresponding location of the layer having the changeable refractive index to induce an amplitude modulation or a phase modulation of a light waveform propagating through the photonic neural network device to configure a corresponding neuron of the photonic neural network device in order to perform a computation.

2. The photonic neural network device of claim 1, wherein the plurality of electrodes are arranged in a plurality of columns of electrodes, wherein each column of electrodes of the plurality of columns of electrodes is a neural network layer of a neural network.

3. The photonic neural network device of claim 2, further comprising a column of diffractive or refractive elements between a first column of electrodes of the plurality of columns of electrodes and a second column of electrodes of the plurality of columns of electrodes.

4. The photonic neural network device of claim 3, wherein the column of diffractive or refractive elements comprises a plurality of planar waveguide lenses.

5. The photonic neural network device of claim 3, wherein at least one of a spacing between the first column of electrodes and the second column of electrodes, a spacing between the first column of electrodes and the column of diffractive or refractive elements, a spacing between adjacent neurons within the second column of electrodes, or a property of the column of diffractive or refractive elements is selected to achieve a selected spread of light between the first column of electrodes and the second column of electrodes.

6. The photonic neural network device of claim 3, wherein the column of diffractive or refractive elements comprises at least one tunable element tunable to control a spread of light between the first column of electrodes and the second column of electrodes.

7. The photonic neural network device of claim 1, wherein the planar waveguide is a single mode planar waveguide.

8. The photonic neural network device of claim 1, wherein the layer having a changeable refractive index comprises a liquid crystal.

9. The photonic neural network device of claim 1, wherein optical nonlinearities of the planar waveguide are exploited to perform nonlinear computations.

10. The photonic neural network device of claim 1, wherein respective shapes of the plurality of electrodes are selected to control optical effects.

11. The photonic neural network device of claim 1, further comprising an optical modulator optically coupled to the planar waveguide, wherein the optical modulator is configured to provide an input waveform to the planar waveguide.

12. The photonic neural network device of claim 1, further comprising a plurality of photodetectors coupled to the planar waveguide, wherein the plurality of photodetectors are configured to detect an output waveform from the planar waveguide.

13. A method comprising:
modelling a photonic neural network device, wherein the photonic neural network device comprises:
a planar waveguide;
a layer having a changeable refractive index adjacent to the planar waveguide; and
a plurality of electrodes, wherein each electrode is electrically coupled to the layer having the changeable refractive index at a corresponding location of the layer having the changeable refractive index, wherein each electrode is configured to apply a corresponding, configurable voltage to the corresponding location to affect a refractive index of the corresponding location of the layer having the changeable refractive index to configure a corresponding neuron of the photonic neural network device in order to perform a computation;
training the modelled photonic neural network, wherein training comprises selecting the corresponding, configurable voltages at corresponding locations so that the corresponding neurons produce a desired output waveform in response to an input waveform; and
physically implementing the trained photonic neural network in a device based on the training.

14. The method of claim 13, wherein the plurality of electrodes are arranged in a plurality of columns of electrodes, wherein each column of the plurality of columns of electrodes is a neural network layer of a neural network, and wherein training the modelled photonic neural network further comprises selecting a spacing between adjacent columns of the plurality of columns of electrodes.

15. The method of claim 14, wherein training the modelled photonic neural network further comprises selecting a spacing between adjacent electrodes within a column of the plurality of columns of electrodes.

16. The method of claim 13, wherein the photonic neural network device further comprises a column of diffractive or refractive elements between a first column of electrodes of the plurality of columns of electrodes and a second column of electrodes of a plurality of columns of electrodes, and wherein training the modelled photonic neural network further comprises selecting a spacing between the column of diffractive or refractive elements and the second column of electrodes.

17. The method of claim 13, wherein the photonic neural network device further comprises a column of diffractive or refractive elements between a first column of electrodes of a plurality of columns of electrodes and a second column of electrodes of a plurality of columns of electrodes, and wherein training the modelled photonic neural network further comprises selecting a property of the diffractive or refractive elements to achieve a selected spread of light between the first column of electrodes and the second column of electrodes.

18. The method of claim 13, wherein training the modelled photonic neural network further comprises selecting respective shapes of the plurality of electrodes to control optical effects.

19. The method of claim 13, wherein physically implementing the trained photonic neural network in the device based on the training comprises configuring corresponding electrodes and corresponding, configurable voltages of selected electrodes from an array of electrodes on a layer having a changeable refractive index adjacent to a planar waveguide to define a physical instantiation of the trained photonic neural network.

20. A photonic neural network device comprising:
a plurality of neural network layers for a neural network, wherein each neural network layer comprises:
a column of neurons, each neuron comprising a corresponding electrode adjacent to a layer having a changeable refractive index, wherein the layer having the changeable refractive index is adjacent to a planar optical waveguide; and
a column of refractive or diffractive elements adjacent to the planar optical waveguide, wherein the photonic neural network is configured to induce an amplitude or a phase modulation of a light waveform propagating through the photonic neural network device to configure a corresponding neuron of the photonic neural network device in order to perform a computation.

* * * * *